United States Patent [19]

Klein

[11] 4,400,692
[45] Aug. 23, 1983

[54] METHOD FOR PERIODIC DIGITAL TO ANALOG CONVERSION

[75] Inventor: Reto Klein, Leuggern, Switzerland

[73] Assignee: BBC Brown, Boveri & Company, Limited, Baden, Switzerland

[21] Appl. No.: 320,675

[22] Filed: Nov. 12, 1981

[30] Foreign Application Priority Data

Nov. 20, 1980 [DE] Fed. Rep. of Germany ....... 3043727

[51] Int. Cl.³ .............................................. H03K 13/02
[52] U.S. Cl. ............................................. 340/347 DA
[58] Field of Search .................. 340/347 DA, 347 M; 375/21

[56] References Cited

U.S. PATENT DOCUMENTS 2,907,021 9/1959 Woods .......................... 340/347 DA
3,831,167 8/1974 Tewksbury .................. 340/347 DA

OTHER PUBLICATIONS

Glick, "Proceedings of the Western Computer Conference", Feb. 1957, pp. 128–133.

Primary Examiner—C. D. Miller
Attorney, Agent, or Firm—Burns, Doane, Swecker & Mathis

[57] ABSTRACT

For converting a digital value into an analog value, the digital value is first converted into a binary number and then selected auxiliary pulse trains corresponding to the binary number are used to control a switch which connects a capacitor alternatively to a reference voltage source or to ground to charge the capacitor to a voltage which corresponds to the converted analog value. The pulses in the auxiliary pulse trains associated with each binary position are grouped into pulse groups and the pulse groups of each pulse train are distributed over the duration of a conversion period in such a manner that during the superimposition of auxiliary pulse trains the number of pulse groups is not increased but the existing pulse groups are widened by being placed next to each other. In addition, the width of the single pulses forming the pulse groups is doubled so that the pulse groups are transformed into width-modulated pulses.

6 Claims, 3 Drawing Figures

METHOD FOR PERIODIC DIGITAL TO ANALOG CONVERSION

FIELD OF THE INVENTION

The present invention relates in general to methods for digital to analog signal conversion and in particular to methods for periodic digital to analog conversion wherein a capacitor is charged to form the analog signal.

BACKGROUND OF THE INVENTION

Information can be obtained, transmitted, processed and represented in the form of digital or analog signals. Since the individual processing steps for the two types of signal require different types of engineering effort, e.g., circuit design, and cannot always be carried out with the same accuracy, it can be advantageous to convert this information from one form of siganl into the other before carrying out various processing steps.

In one conventional technique, digital signals are converted into analog signals by feeding pulse-shaped voltages which correspond to the digital signals and which appear successively in time to a capacitor, where the voltages are summed to produce a voltage corresponding to the analog signal. To be useful, this technique must normally satisfy three requirements: the setting-up or generating time for the analog signal should be short, the ripple in the analog signal caused by the summation of the individual voltage values should be as small as possible, and the analog signal ripple should be affected as little as possible by those characteristics of the electronic components which are temperature dependent.

Heretofore, two different methods, which can be simply implemented with commercially available and relatively cheap components, have been used to carry out the aforementioned type of digital to analog conversion. These two methods convert, respectively, pulses corresponding to the digital signals and having a constant repetition frequency and variable pulse width and pulses having a constant pulse width and variable repetition frequency. Practical experience has shown, and calculations have confirmed, that neither of these two methods optimally meets the three abovementioned requirements.

In the conversion of pulses having a constant repetition frequency and variable width, the temperature-dependent characteristics of the electronic components have only little influence on the analog value, but the generation time is too long for most applications. Further, the ripple depends on the ratio of the pulse duration to the duration of the conversion period. The ripple reaches its highest value when the duration of the pulse is approximately half as long as the duration of the conversion period and almost reaches a zero value only when the ratio approaches zero or 1.

In the conversion of pulses having a constant width and variable repetition frequency, the generating time is very short and the ripple decreases with an increase in the ratio of pulse width to pulse spacing, practically reaching a zero value when the pulse width approximates the pulse spacing, but the temperature-dependent characteristics of the electronic components have a relatively large influence on the analog value and this influence increases with an increase in the repetition frequency and in the number of pulses in one conversion period.

SUMMARY OF THE INVENTION

Accordingly, it is the object of the present invention to periodically convert a digital signal into an analog signal which requires only a very short generating time and which produces an analog signal having very little ripple and virtually no sensitivity to circuit performance variations caused by temperature fluctuations.

This object is achieved in accordance with the present invention by summing during a conversion period the pulses of selected auxiliary pulse trains to form a composite pulse train which is used to control a switch connecting a capacitor to a predetermined voltage source in order to charge the capacitor to a voltage constituting the analog signal. The auxiliary pulse trains which are summed are selected in dependence on the value of each binary position of a binary number signal corresponding to the value of the digital signal. Each of the auxiliary pulse trains corresponds to one of the binary positions and has a number of pulses equal to the value of $2^N$, where N is the number of the corresponding binary position. The pulses in each auxiliary pulse train starting with at least the auxiliary pulse train for the third binary position form pulse groups containing an equal number of pulses. The auxiliary pulse train for the highest number binary position has an even number of pulse groups, and the number of pulses in each pulse group is identical to the number of clock pulses in each interval between successive pulse groups. Each pulse group in the other auxiliary pulse train contains no more than half as many pulses as each pulse group in the auxiliary pulse train for the highest number binary position. Additionally, pulse groups in the various auxiliary pulse trains are displaced with respect to one another such that pulse groups from each auxiliary pulse train can be concatenated with pulse groups from at least one other auxiliary pulse train when the pulse trains are summed. Advantageously, the pulse groups are displaced such that the first or last pulse in the pulse groups from each auxiliary pulse train other than the auxiliary pulse train for the highest number binary position either can concatenate with the last pulse, or can precede the first pulse, of a pulse group from the auxiliary pulse train for the highest binary position. Advantageously, the pulses of the composite pulse train are widened to form width-modulated pulses in place of the pulse groups.

The method of the present invention can be implemented with simple and commercially available components and allows digital values to be converted into analog values (1) with the same short generating time which heretofore could be achieved only by converting pulses having a constant width and variable pulse sequence, (2) with the same, relatively small ripple which would heretofore be achieved only by converting pulses having a constant repetition frequency and optimized width, and (3) with a temperature independence which cannot be achieved with either of the two abovementioned methods.

In a first preferred embodiment of the method according to the present invention, in which a digital signal corresponding to a binary number with at least five binary positions is converted, the auxiliary pulse train for the highest value binary position has four pulse groups in each conversion period.

In a second preferred embodiment of the method according to the present invention, in which a digital signal corresponding to a binary number having at least six binary positions is converted, the number of the pulse groups in the auxiliary pulse train for the highest value binary position is in each conversion period equal to the integral square root of the number of clock pulses required for converting the binary number or the binary number which is smaller by one binary position.

A further advantage of these preferred embodiments of auxiliary pulse trains is that they have, for a smallest possible number of pulse groups, an even distribution and a favorable ratio of pulse groups and intervals.

These and other features and advantages of the present invention will be disclosed in or apparent from the following detailed description of a preferred embodiment.

BRIEF DESCRIPTION OF THE DRAWINGS

In the detailed description which follows, a preferred embodiment of a digital to analog converter constructed in accordance with the present invention is described with reference to the drawings, in which.

DETAILED DESCRIPTION OF A PREFERRED EMBODIMENT

Figure 1:
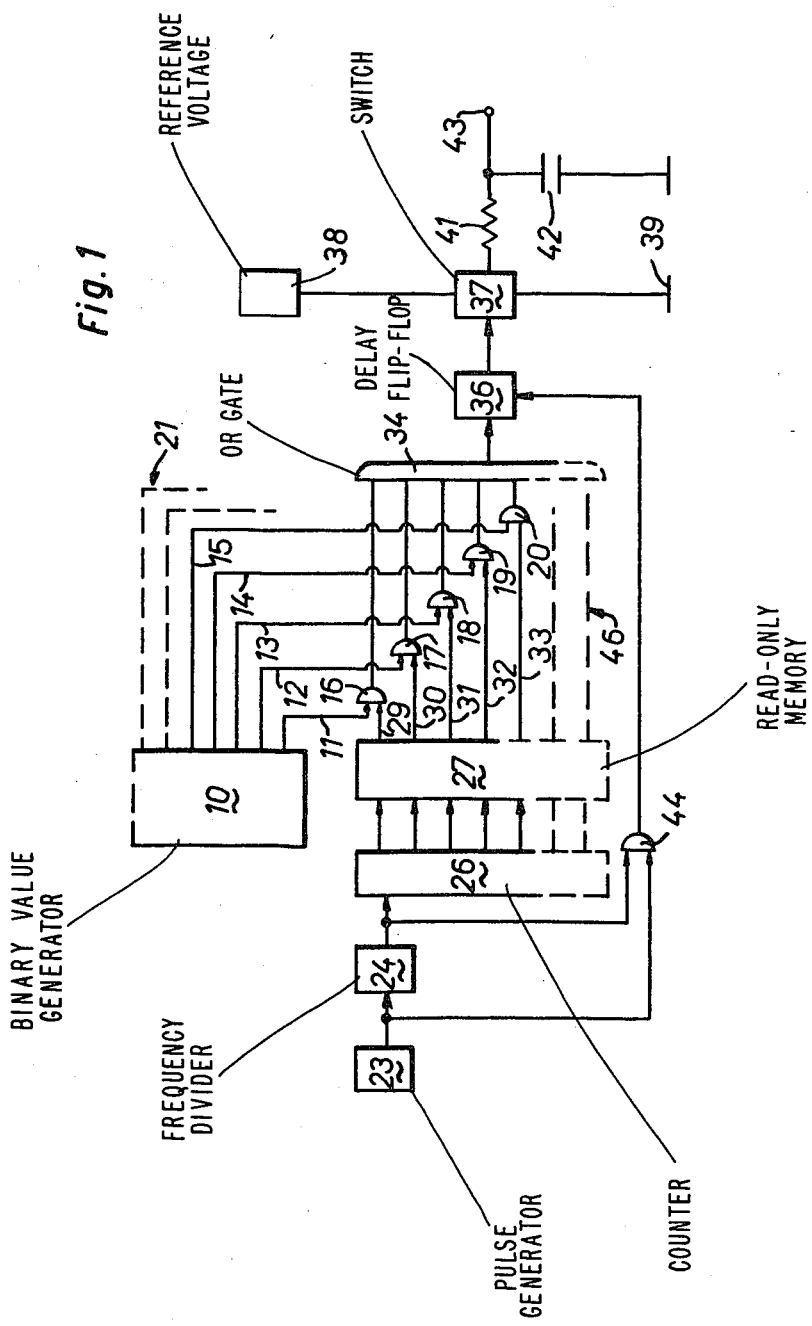
FIG. 1 is a schematic block diagram of the converter.

Referring to FIG. 1, a digital to analog (D/A) converter constructed in accordance with the present invention comprises a conventional binary value generator 10 which converts the digital signal to be converted into a binary number signal. As will be appreciated, the digital signal is fed to generator 10 as an input signal, which has not been illustrated. Binary value generator 10 has a separate output for each binary position. In the illustrated embodiment, five of these outputs, corresponding to binary positions $2^0$, $2^1$, $2^2$, $2^3$ and $2^4$, are respectively connected by means of lines 11, 12, 13, 14 and 15 with one input of a corresponding AND gate 16, 17, 18, 19 and 20.

The D/A converter also includes a conventional pulse generator 23 which generates pulses with a constant repetition frequency. The output of the pulse generator 23 is connected to a frequency divider 24 which produces a continuous pulse sequence output. The output pulses of divider 24 serve, and are hereinafter referred to, as clock pulses and control the timing of the successive operating cycles of the components still to be described. Advantageously, the repetition frequency of the clock pulses is half the frequency of the primary pulses generated by pulse generator 23.

The output of frequency divider 24 is connected to the input of a conventional counter 26. The counter has a plurality of duplicate outputs, each of which is connected to a separate storage block in a read-only memory 27. Each memory storage block corresponds to one of the binary position outputs of binary value generator 10 and the number of storage locations in each storage block is identical to the highest binary number which can be generated by binary value generator 10. In the storage locations of each storage block an auxiliary pulse train is distributively stored. The number of pulses in each pulse train is identical to the number corresponding to the associated binary position. Hence, the auxiliary pulse train for the $2^0$ binary position contains one pulse, the $2^1$ auxiliary pulse train contains two pulses, the $2^2$ pulse train contains four pulses, and so on. The individual pulses in each pulse train are stored in selected ones of the storage locations in each storage block as is described more fully hereinbelow. The storage locations of each storage block are sequentially addressed with the count reached by counter 26 so that for each count the contents of the corresponding storage locations appear at the output of the storage blocks. Counter 26 is configured in a conventional manner to count from zero to the highest binary number which can be generated by binary value generator 10 and then resets to begin again with the initial count. In this manner, the storage locations in the storage blocks are continuously addressed and a continuous sequence of the stored auxiliary pulse trains appears at the output of the storage blocks.

The output of each storage block is connected via an associated signal line 29, 30, 31, 32 and 33 to the second input of the corresponding one of AND gates 16–20, i.e., such that the inputs of each AND gate are connected with that connection of binary value generator 10 and that storage block of memory 27 which are both associated with the same binary position.

The outputs of AND gates 16–20 are connected to corresponding inputs of an OR gate 34, the output of which is connected to the signal input of a delay flip-flop 36. The output of flip flop 36 is connected to the control input of an electronic switch 37, the output of which is alternatively connected to a reference voltage source 38 or to ground (e.g., a ground line) 39 depending on the state of the output of flip flop 36. The output of electronic switch 37 is also connected to an output terminal 43 of the D/A converter via resistor 41. Output terminal 43 is also connected to ground via a capacitor 42, as shown.

The control input of delay flip-flop 36 is connected to the output of another AND gate 44, the two inputs of which are respectively connected to the outputs of pulse generator 23 and frequency divider 24. At the output of AND gate 44, a pulse sequence appears, the pulses of which are displaced with respect to the clock pulses produced by frequency divider 24 by ½ pulse width or ¼ clock period.

It will be appreciated that for purposes of clarity, a simplified circuit has been described in which the logic circuitry works without significant delay and temporary storage is not required. It will also be appreciated that the invention is not limited to conversion of digital signals for which the binary representation is no greater than the assumed five binary positions. Thus, practical embodiments can accommodate more than five binary positions, which fact has been indicated by the dashed lines 21 and 46 and the parts of counter 26, read-only memory 27, and OR gate 34 which have been drawn in dashed line.

In describing the operation of the D/A converter shown in FIG. 1, it shall be assumed that the digital signal to be converted can be represented by five binary positions and that read-only memory 27 thus contains five storage blocks. Based on the highest number which can be represented with five binary positions, 32 pulses at the output of frequency divider 24 form one conversion period.

When the D/A converter is switched on, pulse generator 23 generates a continuous primary pulse sequence which consists of rectangular pulses which are generated by intervals, the duration of which is equal to the duration of the rectangular pulses. This primary pulse sequence is converted in frequency divider 24 into the clock pulse sequence, the pulses of which and the intervals between successive pulses of which are twice as long as duration as those in the primary pulse sequence. As has already been described above, the clock pulses are counted in counter 26 and the instantaneous count is fed to all storage blocks in read-only memory 27 where it is used for addressing the storage locations to be read out.

Figure 2:
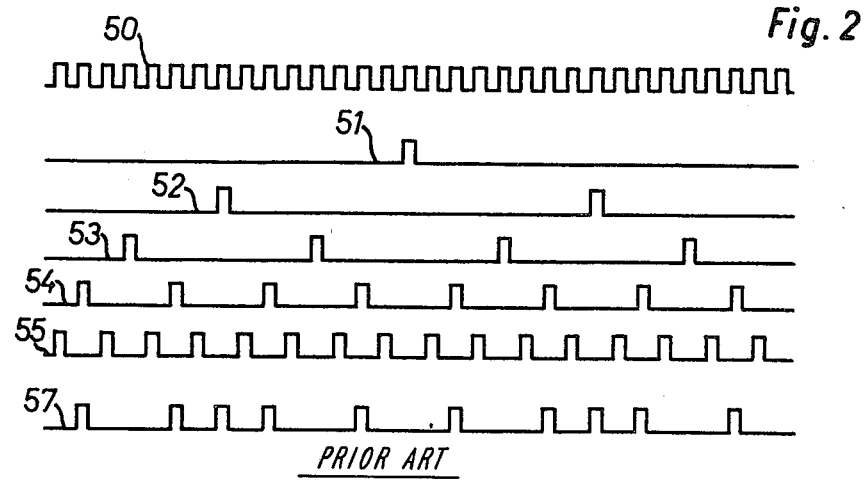
FIG. 2 is a graphical representation of conventional exemplary auxiliary pulse trains.

The corresponding auxiliary pulse sequences are thus caused to appear at the outputs of the storage block. It is to be understood that the predetermined number of pulses in each pulse train can be distributed among the storage locations of the corresponding storage blocks in an arbitrary manner, thereby obtaining arbitrary intervals between the pulses in each pulse train, provided that for each clock pulse at most one pulse appears at each of the outputs of memory 27. Conventionally, "symmetrical" auxiliary pulse trains or sequences have been used in which the individual pulses are stored so as to be separated by intervals of identical lengths when they are read out. An example of a set of such conventional auxiliary pulse trains is shown in FIG. 2. The pulse sequence 50 corresponds to the 32 clock pulses required during one conversion period for a five-digit binary number. As has already been described, these clock pulses are counted and their ordinal number is used as an address for reading out the associated storage locations. The auxiliary pulse train 51 corresponds to the binary position $2^0$ and, for this reason, only contains one counting pulse. The pulse is stored so as to appear as an output in the middle of the conversion period, or at the 15th clock pulse. The auxiliary pulse train 52 corresponds to binary position $2^1$ and therefore contains two counting pulses which appear after the first and the third quarter of the conversion period, or with the 7th and with the 23rd clock period. The other auxiliary pulse trains 53, 54, 55 corresponding to binary positions $2^2$, $2^3$ and $2^4$, are configured in the same manner.

If the symmetrical auxiliary pulse trains are shown in FIG. 2 were stored in memory 27, the auxiliary pulse trains 51, 52, 53, 54 and 55 are shown in FIG. 2 would appear in synchronization with the clock pulses at the outputs of memory 27 and would be fed via the lines 29, 30, 31, 32 and 33 to the other inputs of AND gates 16, 17, 18, 19 and 20. If, for example, a digital signal corresponding to the value 10 were to be converted, the binary number 01010 would appear at the five outputs of binary value generator 10. The individual binary position values 0,1,0,1,0 would be fed via lines 11, 12, 13, 14 and 15 to the corresponding inputs of AND gates 16, 17, 18, 19 and 20, respectively. Consequently, AND gates 17 and 19 would be gated open and the auxiliary pulse trains 52 and 54 would be fed to OR gate 34 while the AND gates 16, 18 and 20 would be inhibited and would block the auxiliary pulse trains 51, 53 and 55. The pulse train 57 would consequently appear at the output of OR gate 34. Since pulse train 57 is derived from the addition of auxiliary pulse trains 52 and 54, pulse train 57 contains in each conversion period 10 individual pulses, the spaces between which vary and are relatively large with respect to the pulse width. If this pulse train were to be used directly for controlling switch 37, the voltage at capacitor 42 and thus the analog output signal at terminal 43 will exhibit the previously mentioned deficiencies, to wit, a large amount of ripple and displacements, caused by temperature fluctuations particularly at switch 37, of the leading and trailing edge of all 10 pulses, which results in relatively large fluctuations of the analog value.

Figure 3:
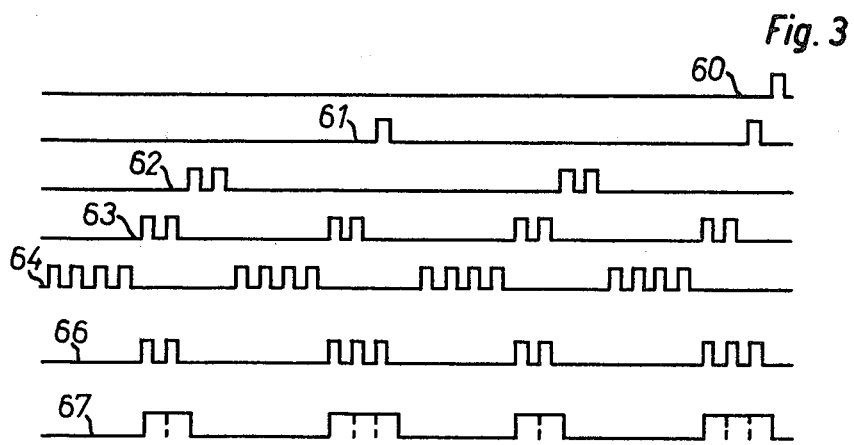
FIG. 3 is a graphical representation of exemplary auxiliary pulse trains in accordance with the present invention.

FIG. 3 shows auxiliary pulse trains 60, 61, 62, 63 and 64, which contain the same number of pulses as auxiliary pulse trains 51 to 55, but which have the pulses thereof grouped in pulse groups in accordance with the present invention. The auxiliary pulse sequence 64, with the largest number of pulses, contains four pulse groups, each of which consists of four successive pulses. The pulse groups are separated from each other by intervals of identical duration in time. The auxiliary pulse trains 63 and 62 contain pulse groups which each contain only half as many pulses as the pulse groups of auxiliary pulse train 64, i.e., two pulses. The auxiliary pulse trains 61 and 60, respectively, contain two single pulses and only a single pulse. In addition, the pulse groups (including the single pulse pulse groups of pulse train 60) are displaced with respect to one another in such a manner that pulse groups from each auxiliary pulse train can be concatenated with pulse groups from at least one other auxiliary pulse train when the pulse trains are summed. Advantageously, the pulse groups are displaced such that the first or last pulse in the pulse groups from each auxiliary pulse train other than the auxiliary pulse train for the highest binary position either can concatenate with the last pulse, or can precede the first pulse, of a pulse group from the auxiliary pulse train for the highest binary position. As shown in FIG. 3, the first pulse of the pulse groups of auxiliary pulse train 63 concatenates with the last pulse of the four-pulse groups of auxiliary pulse train 64, and the last pulse of the pulse groups of auxiliary pulse train 62 precedes the first pulse of the second and fourth pulse group, respectively, of auxiliary pulse train 64. In a like manner, the two single pulses of auxiliary pulse train 61 follow the second and fourth pulse groups of auxiliary pulse train 63, and the single pulse of auxiliary pulse train 60 follows the second pulse of auxiliary pulse train 61.

In order to convert a digital signal having the value 10, AND gates 17 and 19 are gated open (as has already been described for the auxiliary pulse trains 52 and 54 shown in FIG. 2) and auxiliary pulse trains 61 and 63 are superimposed or added in OR gate 34 so that pulse train 66 appears at the output of OR gate 34. Pulse train 66 contains ten single pulses which form four individual pulse groups, of which two each contain two single pulses and two each contain three single pulses. In accordance with the present invention, the pulses appearing at the output of OR gate 34 are widened in delay flip flop 36 to the duration of a clock period, i.e., their width is doubled. As a consequence of widening, the trailing edge of each pulse coincides with the leading edge of the immediately following pulse so that successive single pulses form a width-modulated pulse, as has been shown for pulse train 67. Instead of ten single pulses, pulse train 67 now contains only four width-modulated pulses with relatively uniform width and distance from each other. As has already been described, pulse train 67 is used to control switch 37, which accordingly connects resistor 41 to reference voltage source 38 for the duration of each of the widened pulse groups and connects resistor 41 to ground during the intervals between successive pulse groups so that a voltage appears at capacitor 42 and output terminal 43 which corresponds to the converted digital value.

Pulse train 67 of the present invention is used in the same manner as conventional pulse train 57 to convert the same digital signal into an analog signal. However, the new pulse train of the present invention has considerable advantages. Because of the reduced number of pulses, the converted analog value is less affected by temperature-related displacements in the pulse edges. The reduced number of pulses, in conjunction with the more uniform distance between successive pulse groups, results in a considerable reduction in ripple. In addition, the generating time for the analog value is significantly reduced by using several width-modulated pulses in each conversion period.

As noted hereinabove, a simplified circuit and operating example have been described to facilitate understanding of the invention. For digital to analog conversion with the accuracy required for commercial measurement and transmission purposes, a ten-digit binary number is usually used, which corresponds to a subdivision of the binary value to be converted into 1,024 bits. An additional requirement is that the generating time for the analog value is no more than $10^{-3}$ seconds. Assuming that stabilization of the voltage at capacitor 42 requires approximately ten conversion periods, and that each conversion period contains about $10^3$ pulses, a maximum pulse width of $10^{-7}$ seconds is possible. If a commercially available embodiment of switch 37 is used, the temperature-related fluctuations of switching time and corresponding fluctuations of charging and discharging time for capacitor 47 can be as great as $10^{-8}$ seconds. This means that the analog value will have a maximum possible error of 10% using the aforementioned conventional auxiliary pulse trains. In contrast, using the pulse trains according to the present invention and the same electronic switch, it is possible to lower the temperature-related error to less than 1%.

It will be appreciated by those of ordinary skill in the art that the present invention is not limited to the disclosed embodiments and that changes and modifications can be made within the scope of the invention. In particular, the method of the present invention can be carried out with other circuits than that described hereinabove. For example, it is possible to use a suitable decoder instead of memory 27 for producing the auxiliary pulse trains. In addition, auxiliary pulse trains can be used in which the pulses have twice the width, which then allows the section of the circuit to be omitted comprising AND gate 44 and delay flip-flop 36, which are used to widen the pulses that have been added.

I claim:

1. A method for converting a digital signal presented in the form of a binary number signal into a analog signal comprising the steps of:

summing during a conversion period the pulses of selected ones of a set of auxiliary pulse trains to form a composite pulse train, wherein: the selected ones of said auxiliary pulse trains are selected in dependence on the value of each binary position of the binary number signal; each one of said auxiliary pulse trains corresponds to one of said binary positions and has a number of pulses equal to the value of $2^N$, where N is the number of the corresponding binary position; the pulses in each auxiliary pulse train starting with at least the auxiliary pulse train for the third binary position form pulse groups containing an equal number of pulses; the auxiliary pulse train for the highest number binary position has an even number of pulse groups and the number of pulses in each pulse group are identical to the number of clock pulses in each interval between successive pulse groups; each pulse group in the auxiliary pulse trains other than the auxiliary pulse train for the highest number binary position contain no more than half as many pulses as each pulse group in the auxiliary pulse train for the highest value binary position; and the pulse groups in the auxiliary pulse trains are displaced in time with respect to one another such that pulse groups from each auxiliary pulse train other than the auxiliary pulse train for the highest number binary position can be concatenated with the last pulse, or can precede the first pulse, of a pulse group from the auxiliary pulse train for the highest number binary position when the pulse trains are summed; and controlling a switch which connects a capacitor to a predetermined voltage source with said composite pulse train in order to charge the capacitor to a voltage constituting the analog signal.

2. A method for converting a digital signal presented in the form of a binary number signal into a analog signal comprising the steps of:

summing during a conversion period the pulses of selected ones of a set of auxiliary pulse trains to form a composite pulse train wherein: the selected ones of said auxiliary pulse trains are selected in dependence on the value of said binary position of the binary number signal; each one of said auxiliary pulse trains corresponds to one of said binary positions and has a number of pulses equal to the value of $2^N$, where N is the number of the corresponding binary position; the pulses in each auxiliary pulse train starting with at least the auxiliary pulse train for the third binary position form pulse groups containing an equal number of pulses; the auxiliary pulse train for the highest number binary position has an even number of pulse groups and the number of pulses in each pulse group are identical to the number of clock pulses in each interval between successive pulse groups; each pulse group in the auxiliary pulse trains other than the auxiliary pulse train for the highest number binary position contain no more than half as many pulses as each pulse group in the auxiliary pulse train for the highest value binary position; and the pulse groups in the auxiliary pulse trains are displaced in time with respect to one another such that pulse groups from each auxiliary pulse train can be concatenated with pulse groups from at least one other auxiliary pulse train when the pulse trains are summed; and controlling a switch which connects a capacitor to a predetermined voltage source with said composite pulse train in order to charge the capacitor to a voltage constituting the analog signal.

3. The method of claim 1 or 2 comprising the further step of, prior to the controlling step, widening the pulses of the composite pulse train to the duration of one clock period in order to convert the pulse groups of the composite pulse train into width-modulated pulses.

4. The method according to claim 3, wherein the pulses are widened after having been summed.

5. The method according to claim 1, wherein the digital signal to be converted corresponds to a binary number having at least five binary positions, and the auxiliary pulse train for the highest value binary position has four pulse groups in each conversion period.

6. The method of claim 1, wherein the digital signal to be converted corresponds to a binary number having at least six binary positions, and the number of the pulse groups in the auxiliary pulse train for the highest value binary position is in each conversion period equal to the integral square root of the number of clock pulses required for converting this binary number or the binary number which is smaller by one binary position.

* * * * *